United States Patent [19]
Mitani

[11] Patent Number: 5,356,823
[45] Date of Patent: Oct. 18, 1994

[54] METHOD OF MANUFACTURING A SEMICONDUCTOR DEVICE

[75] Inventor: Tatsuro Mitani, Tokyo, Japan

[73] Assignee: Kabushiki Kaisha Toshiba, Kawasaki, Japan

[21] Appl. No.: 841,206

[22] Filed: Feb. 27, 1992

Related U.S. Application Data

[63] Continuation of Ser. No. 631,840, Dec. 21, 1990, abandoned.

[30] Foreign Application Priority Data

Dec. 22, 1989 [JP] Japan .................. 1-334548

[51] Int. Cl.⁵ ......................................... H01L 21/265
[52] U.S. Cl. ................... 437/40; 437/203; 437/234; 437/912; 148/DIG. 131
[58] Field of Search .............. 437/40, 203, 983, 912, 437/68, 67, 66, 228, 243, 234, 947; 148/DIG. 135, DIG. 161

[56] References Cited

U.S. PATENT DOCUMENTS

| | | | |
|---|---|---|---|
| 4,029,531 | 6/1977 | Marinelli | 437/203 |
| 4,040,168 | 8/1977 | Huang | 437/203 |
| 4,448,797 | 5/1984 | Burnham | 437/203 |
| 4,484,979 | 11/1984 | Stocker | 437/238 |
| 4,577,395 | 3/1986 | Shibata | 437/203 |
| 4,702,000 | 10/1987 | Matlock et al. | 148/DIG. 131 |
| 4,774,206 | 9/1988 | Willer | 437/203 |
| 4,879,254 | 11/1989 | Tsuzuki et al. | 437/203 |
| 4,889,827 | 12/1989 | Willer | 437/203 |
| 4,960,723 | 10/1990 | Davies | 437/203 |

FOREIGN PATENT DOCUMENTS

| | | | |
|---|---|---|---|
| 0002030 | 1/1983 | Japan | 437/243 |
| 0161715 | 7/1986 | Japan | 437/203 |
| 0081769 | 4/1987 | Japan | 437/40 |
| 0130541 | 6/1987 | Japan | 437/203 |
| 0158363 | 7/1987 | Japan | 437/40 |
| 0278337 | 11/1988 | Japan | 437/203 |
| 0287068 | 11/1988 | Japan | 437/225 |
| 0296352 | 12/1988 | Japan | 437/947 |
| 0028923 | 1/1989 | Japan | 437/947 |
| 2020021 | 1/1990 | Japan | |

OTHER PUBLICATIONS

Simple method to create tapering trenches; IBM Tech. Dis. Bulletin, vol. 27, No. 10B; Mar. 1985; 5996–5997.
IBM Technical Disclosure Bulletin, vol. 22, No. 11, Apr. 1980, pp. 4883–4885; "Method For Controlling via Sidewall Slope", Chang et al.
Wolf et al. "Silicon Processing for the VLSI Era"; vol. 1, 1986, pp. 539–542.

Primary Examiner—Brian Hearn
Assistant Examiner—Michael Trinh
Attorney, Agent, or Firm—Finnegan, Henderson, Farabow, Garrett & Dunner

[57] ABSTRACT

A semiconductor layer undergoes isolation etching and gate recess etching, using a side wall insulating layer having the shape of a forward taper as a mask, by means of the anisotropic etching technique. The shape of the side wall of the semiconductor layer corresponds to that of the forward taper of the mask. The shape of the forward taper is always constant, irrespective of face orientation of crystal of the semiconductor layer. Since the taper angle of the side wall insulating layer can freely be set within a predetermined range in accordance with conditions, the taper angle of the semiconductor layer can be controlled. The design margin of an electrode wiring pattern is greatly improved. Since the side wall of a gate recess is stably formed in the shape of a forward taper, the side wall insulating layer can be formed on the surface of the forward taper and thus a gate electrode layer can be formed so as to have a T-shaped cross section. Therefore, the gate resistance can be greatly reduced.

3 Claims, 5 Drawing Sheets

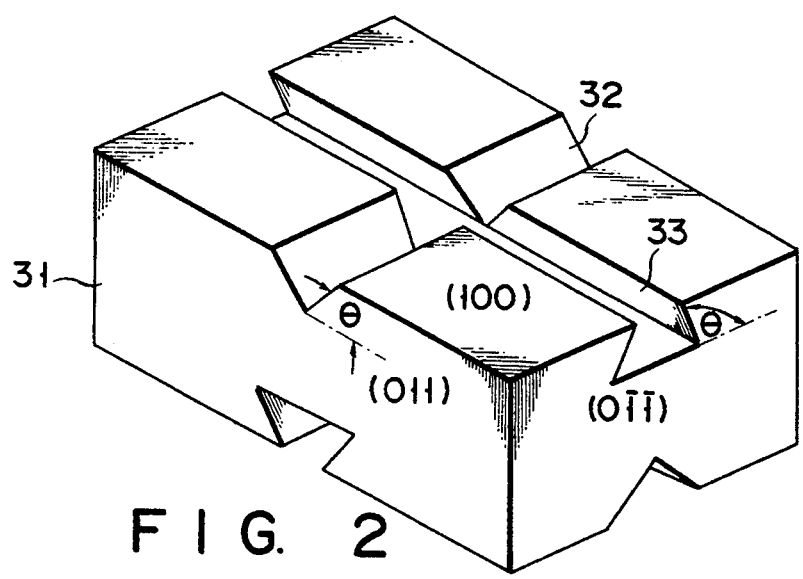
F I G. 2

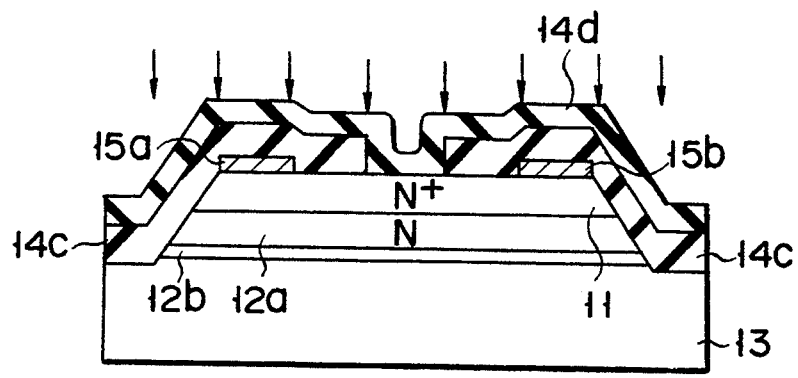
F I G. 3D
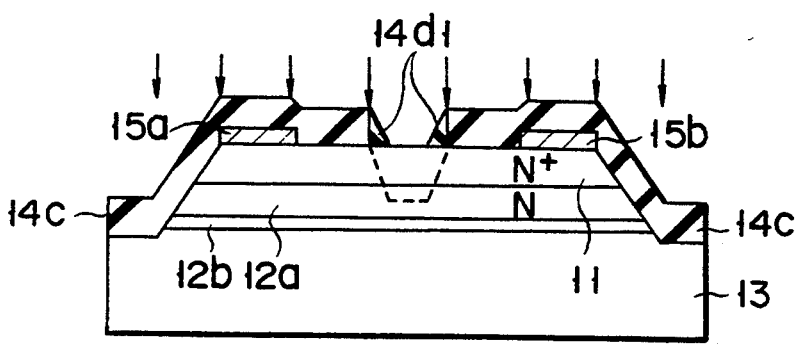
F I G. 3E
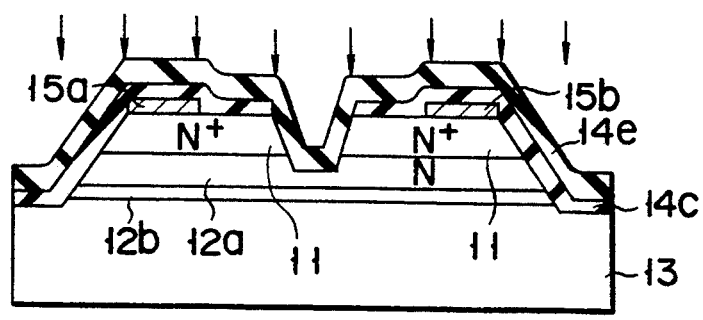
F I G. 3F

METHOD OF MANUFACTURING A SEMICONDUCTOR DEVICE

This application is a continuation of application Ser. No. 07/631,840, filed Dec. 21, 1990, now abandoned.

BACKGROUND OF THE INVENTION

1. Field of the Invention

The present invention relates to a method of manufacturing a semiconductor device and, more particularly, to a method of manufacturing a semiconductor device which is suitable for an isolation step and a gate recess step of manufacturing a superhigh frequency GaAs FET, GaAs IC and the like.

2. Description of the Related Art

A conventional method of manufacturing a high electron mobility transistor (HEMT) or a GaAs FET having an epitaxial gate recess structure will be described below, using the HEMT by way of example.

As illustrated in FIG. 1A, a GaAs undoped buffer layer 23 is prepared and a channel layer 22b is formed thereon by the epitaxial growth technique. An N-type electron supply layer 22a of $Al_xGa_{1-x}As$ is formed on the channel layer 22b and then a high-concentration N+-type cap layer 21 of GaAs is formed on the layer 22a. A wafer is thus formed. As shown in FIG. 1B, an insulating film 24 which is to serve as a mask for etching is formed on the wafer. The wafer is mesa-etched by etchant of phosphoric acid or hydrogen peroxide, and thus the N+-type cap layer 21, the N-type channel layer 22b and the electron supply layer 22a are removed so as to have the shape of a taper and the elements are isolated to such an extent as to reach a buffer layer 23. The insulating film 24 is then removed. As shown in FIG. 1C, an ohmic metal 25a serving as a source electrode and an ohmic metal 25b serving as a drain electrode are formed. Then patterning of a resist 26a is performed to form a gate electrode, the N+-type cap layer 21 is removed by the above etchant, and the N-type electron supply layer 22a undergoes recess etching to form a recess having a desired depth. Using a gate pattern of the resist 26a as a mask, a gate metal is deposited and, as illustrated in FIG. 1D, a gate electrode layer 27c is formed in the recess by a lift-off technique. An electrode wiring layer including a pad (bonding portion) is then patterned in the resist 26b to deposit a pad metal 27. As shown in FIG. 1E, a source electrode wiring layer 27a and a drain electrode wiring layer 27b are formed by a lift-off operation. A FET having drain, source and gate terminals D, S and G can thus be obtained. The mesa etching of the GaAs layer shown in FIG. 1B and the recess etching of the gate shown in FIG. 1C are conventionally replaced with wet etching using a mixed liquid such as phosphoric acid or hydrogen peroxide.

In the GaAs layer shown in FIG. 2, the cross-section of a mesa groove depends on a direction of the groove with respect to crystal face, i.e., face orientation of crystal. More specifically, when the major surface of a GaAs substrate 31 has a face orientation of (100) and a mesa groove 32 is vertically formed from the major surface to a surface having a face orientation of (011), the groove is formed in the shape of a forward mesa and its cross-section is therefore has the shape of a forward taper. When the mesa groove 33 is formed in parallel with the surface having a face orientation of (011), the groove is formed in the shape of a reverse mesa and its cross-section is therefore has the shape of a reverse taper. When angle θ of the slant of each of the grooves and the major surface of the substrate is acute, the groove has a cross-section of forward taper in shape. When the angle is obtuse, the groove has a cross-section of shape of reverse taper in shape.

If the GaAs layer undergoes the mesa etching or recess etching, the side wall of the groove are formed in the shape of a forward taper or a reverse taper in accordance with the orientation of the crystal face.

When an electrode wire is formed while crossing a groove having a cross-section of a reverse taper in shape, the wire tends to disconnection by a difference in level between the groove and the major surface. It is thus necessary to avoid forming a groove having a reverse taper in shape with respect to the wiring layer of a GaAs IC or the direction in which the gate electrode is led out since the groove restricts the design margin of the electrode wiring pattern and prevents a chip from decreasing in size. When the recess of the gate is shaped like a reverse taper, the withstanding voltage between the gate and source regions or between the gate and drain regions is lower than when the recess is shaped like a forward taper.

According to the conventional technique, the gate region undergoes recess-etching and, as shown in FIG. 1C, gate metal is evaporated from above using the gate pattern of the resist 26a as a mask, then the gate electrode is formed by the lift-off technique. The cross-section of the gate electrode is triangular in shape and accordingly the resistance of the gate region increases. For this reason, the high-frequency characteristic, especially the noise characteristic, deteriorates. In the conventional lift-off technique, the taper angle of the gate recess structure cannot be freely controlled, and the gate electrode has a variation in shape. The reproductivity of the shape is degraded and a fixed gate resistance is not exhibited, which causes a variation in characteristics.

SUMMARY OF THE INVENTION

It is accordingly an object of the present invention to provide a method of manufacturing a semiconductor device in which, when a semiconductor layer undergoes mesa-etching or recess-etching, the side wall of a groove is stably formed in the shape of a forward taper, irrespective of the orientation of crystal face and, at the same time, a gate resistance is considerably lowered and a gate withstanding voltage is enhanced, thereby obtaining a satisfactory high-frequency characteristic and improving in yield.

A method of manufacturing a semiconductor device according to the present invention, comprises the steps of: forming a first insulating layer in a predetermined region of a semiconductor layer; forming a second insulating layer on a surface and a side wall of the first insulating layer; etching back the second insulating layer to leave a side wall insulating layer on the side wall of the first insulating layer; and forming a side wall on the semiconductor layer by anisotropic dry etching, using the first insulating layer and the side wall insulating layer as a mask.

A method of manufacturing a semiconductor device according to the present invention, comprises the steps of: forming a first insulating layer in a predetermined region of a semiconductor layer; forming a second insulating layer on a surface and a side wall of the first insulating layer; etching back the second insulating layer to leave a first side wall insulating layer on the side wall of the first insulating layer; mesa-etching the semiconductor layer by anisotropic dry etching, using the first insulating layer and the first side wall insulating layer as masks to form a side wall for element isolation; forming a source electrode and a drain electrode in a predetermined region of the surface of the semiconductor layer; forming a third insulating layer having a gate opening on the surface of the semiconductor layer; forming a fourth insulating layer on a surface and an end face of the gate opening; etching back the fourth insulating layer to leave a second side wall insulating layer on a side wall of the gate opening of the third insulating layer; gate-recess-etching the semiconductor layer by the anisotropic dry etching, using the third insulating layer and the second side wall insulating layer as masks, to form a gate recess thereon; forming a fifth insulating layer on the entire surface of a resultant structure and etching back the fifth insulating layer to form a third side wall insulating layer on a side wall of the gate recess; and forming a gate electrode in the gate recess.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 2 is a perspective view showing the relationship between the face orientation of GaAs crystal and the shape of a cross-section of a mesa groove when the GaAs crystal undergoes wet-etching; and FIGS. 3A to 3H are cross-sectional views showing the steps of manufacturing a semiconductor device according to an embodiment of the present invention.

DETAILED DESCRIPTION OF THE PREFERRED EMBODIMENT

A method of manufacturing a semiconductor device according to the present invention will be described with reference to FIGS. 3A to 3H which show the steps of manufacturing a HEMT.

Figure 1A:
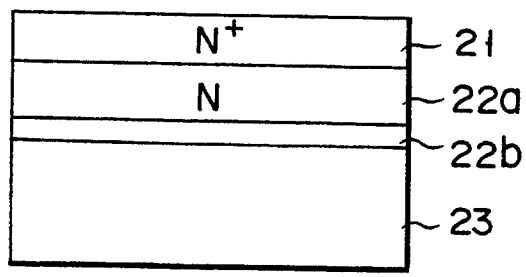
FIGS. 1A to 1E are cross-sectional views showing the steps of manufacturing a conventional semiconductor device.
Figure 1B:
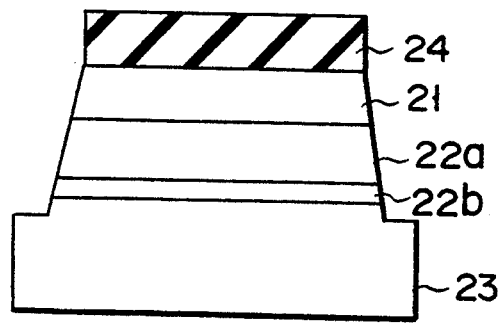
Figure 1C:
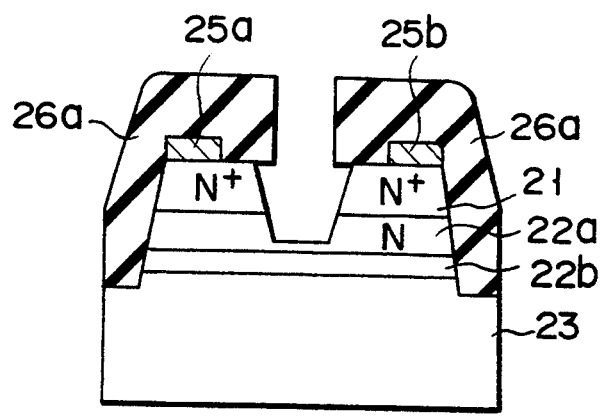
Figure 1D:
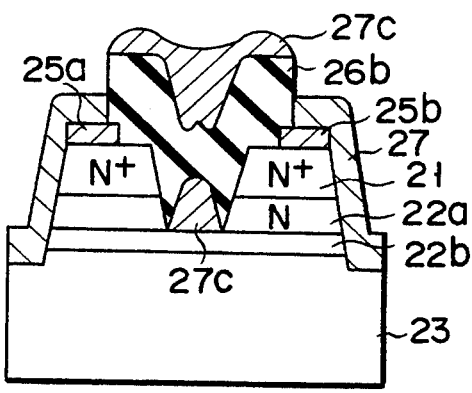
Figure 1E:
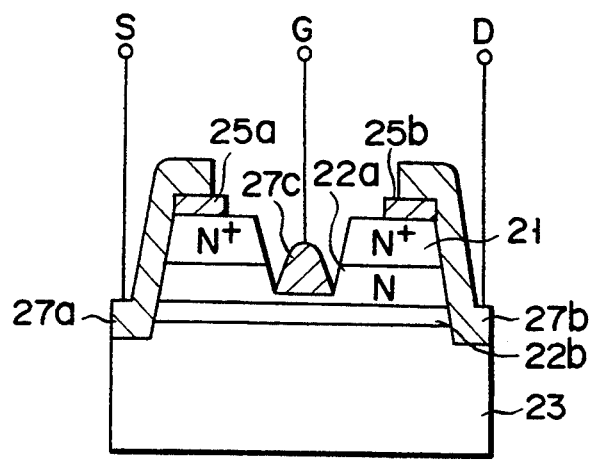
Figure 3A:
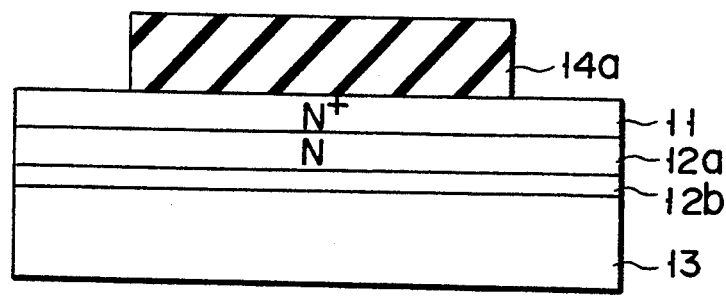

As shown in FIG. 3A, a GaAs undoped channel layer 12b is formed on a GaAs undoped buffer layer 13 by the epitaxial growth technique; an N-type electron supply layer 12a of $Al_xGa_{1-x}As$ is formed on the layer 12b; and a high-concentration GaAs N+-type cap layer 11 is formed on the layer 12a. A wafer is thus prepared. A first insulating film 14a made of $SiO_2$ or the like is formed on an N+-type cap layer 11 as an etching mask for element isolation, and then patterned.

Figure 3B:
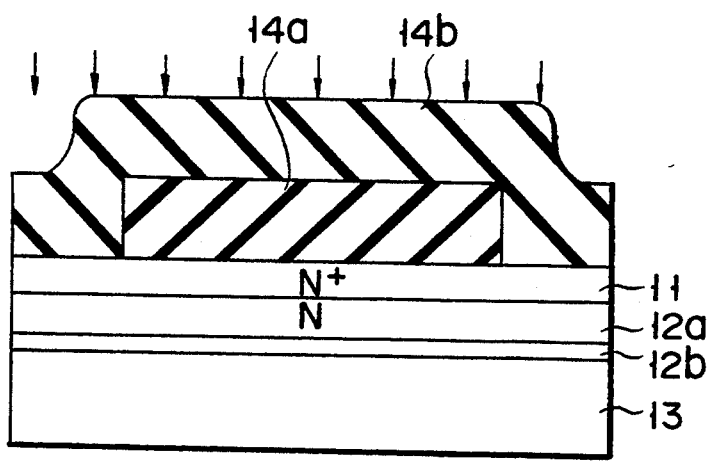

As shown in FIG. 3B, $SiO_2$ is deposited on the entire surface of the wafer by plasma chemical vapor deposition (CVD) to form a second insulating film 14b so as to cover all the surface and the side of the first insulating film 14a. The materials of the first and second insulating films need not be always equal to each other. The entire surface of the resultant structure is then etched back by reactive ion etching (RIE). The arrows shown in FIGS. 3B to 3F indicate the flow of ions when the RIE is carried out.

Figure 3C:
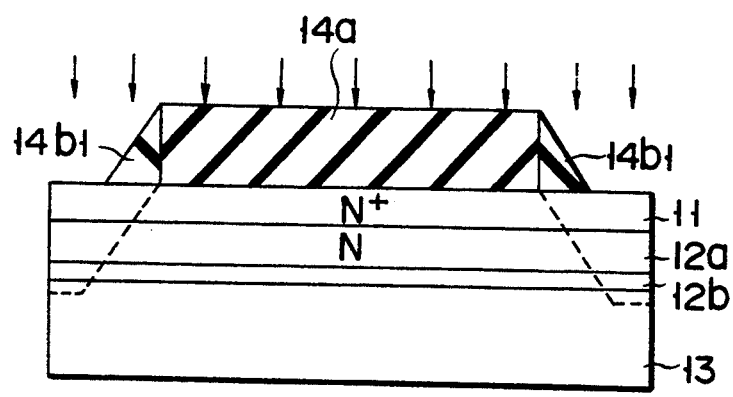

As illustrated in FIG. 3C, a difference in reactive speed of the RIE causes the side wall of first insulating film 14a to remain as a side wall insulating film 14bl having the shape of a forward taper. The shape of the side wall insulating film 14bl can be varied within a certain range in accordance with the thickness of second insulating film 14b. If the second insulating film 14b is thinned, for example, the slant of the side wall insulating film 14bl becomes gentle. The entire surface of the resultant structure is then subjected to intensive anisotropic dry etching by sputter etching such as ion milling, using the side wall insulating film 14bl and the first insulating film 14a as masks. Therefore, as indicated by the broken line in FIG. 3C, the shape of the masks is transferred onto the wafer and a forward taper for element isolation is obtained around the wafer. Unlike the wet etching, the forward taper can be obtained in all directions, irrespective of the face orientation of crystal of the GaAs wafer.

As illustrated in FIG. 3D, the insulating film 14a and the side wall insulating film 14bl remaining after the dry etching are removed to form an ohmic metal 15a serving as a source electrode and an ohmic metal 15b serving as a drain electrode. After an insulating film 14c (corresponding to the first insulating film) having a gate opening as an etching mask of a gate recess is formed by the same technique shown in FIGS. 3B and 3C, an insulating film 14d (corresponding to the second insulating film) is deposited on the entire surface of the insulating film 14c including the side wall of the opening of the insulating film 14c.

As illustrated in FIG. 3E, the insulating film 14d is etched back to leave a sidewall insulating film 14dl having the shape of a forward taper on the side wall of the opening of the insulating film 14c. The entire surface of the resultant structure is then subjected to intensive anisotropic dry etching by the sputter etching, using the insulating film 14c and the sidewall insulating film 14dl as masks, and then a gate recess is so formed that it penetrates the N+-type cap layer 11, which is exposed to the gate opening, and reaches the N-type electron supply layer 12a. The depth of the gate recess is determined in accordance with a control of a drain current. The forward taper of the sidewall insulating film 14dl is transferred onto the side wall of the gate recess, as indicated by the broken line in FIG. 3E.

Figure 3G:
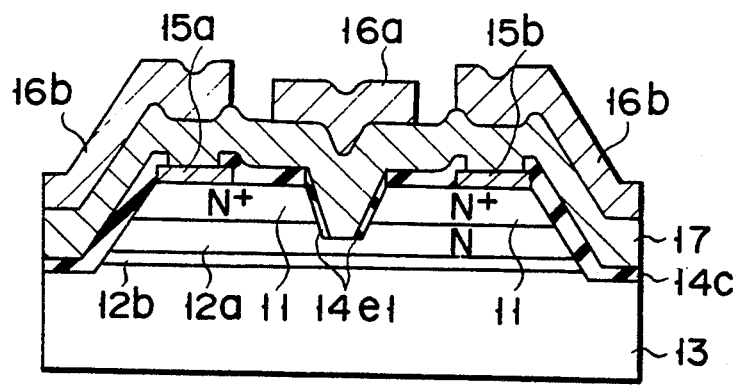

As illustrated in FIG. 3F, an insulating film 14e having an uniform thickness is deposited from above by the plasma CVD and then the insulating film 14e is dry-etched by the RIE to form a gate recess. A difference in reactive speed causes a side wall insulating film 14el to remain on the tapered surface of the gate recess (FIG. 3G). The insulating film 14el is used as an insulating film of the side of a T-shaped gate electrode which is to be formed later. The side wall insulating film 14el can be used in the present invention since it can be always shaped into a forward taper with good reproducibility by the dry etching and thus a variation in characteristics is reduced.

As shown in FIG. 3G, after the gate recess is formed, the insulating films on the ohmic metals 15a and 15b are removed to form source and drain regions. Then a metal 17 such as Ti/Al or Ti/Pt/Au is deposited on the entire surface of the resultant structure. The metal 17 contacts both source electrode 15a and drain electrode 15b. A gate pattern 16a and pad patterns 16b of the source and drain regions are simultaneously formed on the metal 17 by resist. The gate pattern 16a is formed so that the cross section of the gate electrode has the shape of T.

Figure 3H:
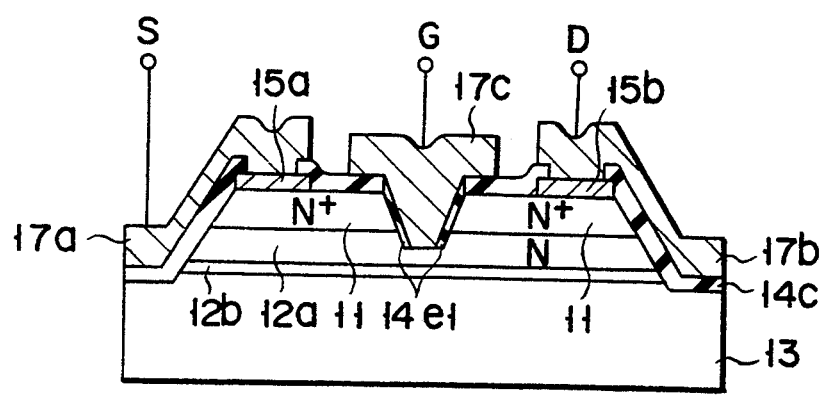

AS shown in FIG. 3H, the metal 17 is dry-etched using the gate pattern 16a and pad patterns 16b to form a source electrode wiring layer 17a, a drain electrode wiring layer 17b and a T-shaped gate electrode 17c. The gate electrode 17c does not have a triangular cross section formed by the lift-off technique but a T-shaped cross section. The sectional area of the gate electrode 17c can be made much larger than that of the gate electrode of the conventional device and the gate resistance can be greatly reduced. Since the gate electrode 17c is made thinner toward its lower end, the gate capacitance is virtually the same as that of the gate electrode of the conventional device. The wiring layers 17a and 17b, and gate electrode 17c are connected to a source terminal C, a drain terminal D and a gate terminal G, respectively. A GaAs FET or a HEMT having an epitaxial gate recess structure is formed on the basis of the foregoing manufacturing steps of the present invention.

According to the above-described method of manufacturing a semiconductor device of the present invention, when the isolation etching shown in FIG. 3D and the gate recess etching are performed, both the mesa face and recess face can be shaped into a forward taper in all crystal orientations, regardless of the face orientation of crystal of GaAs. For this reason, the margin of leading out the wiring of a GaAs IC is extremely enhanced, as compared with the conventional method; therefore, the design margin of the IC is increased and a chip can be easily miniaturized, resulting in low cost in manufacture.

Since the taper angle of the side wall insulating film can be freely controlled within a certain range by changing manufacturing conditions, the taper angles of the mesa face and the recess side can be controlled. A gate electrode having a predetermined shape can thus be obtained, so that a variation in the withstanding voltage of the gate electrode can be reduced and no disconnection occurs. The semiconductor device can be stably manufactured throughout the steps and the yield is improved.

In a FET and an IC manufactured using the method according to the present invention, the gate resistance can be greatly decreased and thus a high-frequency characteristic susceptible to the gate and source resistances, especially a high-frequency noise characteristic can be greatly improved.

In the foregoing embodiments, the GaAs FET and HEMT having a gate recess structure are described. The manufacturing method according to the present invention can be applied to a method of manufacturing another semiconductor device in which the taper of a mesa face is shaped into a reverse taper in accordance with the face orientation of crystal when the mesa-etching is performed.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:
   forming a first insulating layer in a selected region on a semiconductor layer;
   forming a second insulating layer on a surface and a side wall of said first insulating layer;
   etching back said second insulating layer to leave a first side wall insulating layer on the side wall of said first insulating layer;
   mesa-etching said semiconductor layer by anisotropic dry etching, using said first insulating layer and said first side wall insulating layer as masks, to form a side wall for element isolation;
   forming a source electrode and a drain electrode in a selected region of the surface of said semiconductor layer;
   forming a third insulating layer having a gate opening on the surface of said semiconductor layer;
   forming a fourth insulating layer on a surface and an end face of said gate opening;
   etching back said fourth insulating layer to leave a second side wall insulating layer on a side wall of said gate opening of said third insulating layer;
   gate-recess-etching said semiconductor layer by said anisotropic dry etching, using said third insulating layer and said second side wall insulating layer as masks, to form a gate recess thereon;
   forming a fifth insulating layer on the entire surface of a resultant structure and etching back said fifth insulating layer to form a third side wall insulating layer on a side wall of said gate recess; and
   forming a gate electrode in said gate recess.

2. The method according to claim 1, wherein said first side wall insulating layer and said second side wall insulating layer are formed in the shape of a forward taper, and said shape is transferred onto said side wall for element isolation and said side wall of said gate recess by said anisotropic etching.

3. The method according to claim 1, wherein said gate electrode is formed so as to have a T-shaped cross section, and said third side wall insulating layer is formed around a leg portion of said gate electrode.

* * * * *